United States Patent [19]

Hochreuther et al.

[11] Patent Number: 5,166,599

[45] Date of Patent: Nov. 24, 1992

[54] MULTIMETER WITH AT LEAST THREE INPUT CONNECTIONS AND MEANS FOR PREVENTING ERRORS DUE TO THE SELECTION OF AN INCORRECT INPUT CONNECTION

[75] Inventors: Karl Hochreuther; Günter Roppelt; Herbert Ziegler; Robert Kindermann, all of Nuremberg; Horst Hopfner, Rückersdorf, all of Fed. Rep. of Germany

[73] Assignee: ABB Patent GmbH, Mannheim, Fed. Rep. of Germany

[21] Appl. No.: 754,459

[22] Filed: Sep. 3, 1991

[30] Foreign Application Priority Data

Sep. 1, 1990 [DE] Fed. Rep. of Germany ....... 4027801

[51] Int. Cl.$^5$ ............................................. G01R 15/12
[52] U.S. Cl. ..................................... 324/115; 324/116; 324/157; 324/110
[58] Field of Search ........... 324/115, 110, 114, 103 R, 324/156, 157, 116; 439/218, 221, 222, 145

[56] References Cited

U.S. PATENT DOCUMENTS

| | | | |
|---|---|---|---|
| 2,288,241 | 6/1942 | Holcomb | 439/145 |
| 4,604,569 | 8/1986 | Tedd et al. | 324/115 |
| 4,632,479 | 12/1986 | Jacobson | 439/145 |
| 4,733,017 | 3/1988 | Wolfe-Taylor et al. | 439/145 |
| 4,952,755 | 8/1990 | Engel et al. | 439/145 |

FOREIGN PATENT DOCUMENTS 0315072 10/1934 Italy ................................. 439/221

Primary Examiner—Vinh Nguyen
Attorney, Agent, or Firm—Herbert L. Lerner; Laurence A. Greenberg

[57] ABSTRACT

In multimeters having a plurality of input connections there is a danger of the measuring conductors being incorrectly connected in such a manner that the setting of the measurement range switch does not correspond to the input connections to which contact is made. In order to avoid damage which may be caused by making an incorrect contact to the input connections, an electrically and/or mechanically acting disabling device is coupled to the measurement range switch for permitting a disabling of particular input connections. The disabling is carried out in such a manner that contact can always only be made to that input connection for receiving a test signal through the measuring conductors, to which a measurable variable is assigned that corresponds to the measurable variable set with the measurement range switch.

28 Claims, 4 Drawing Sheets

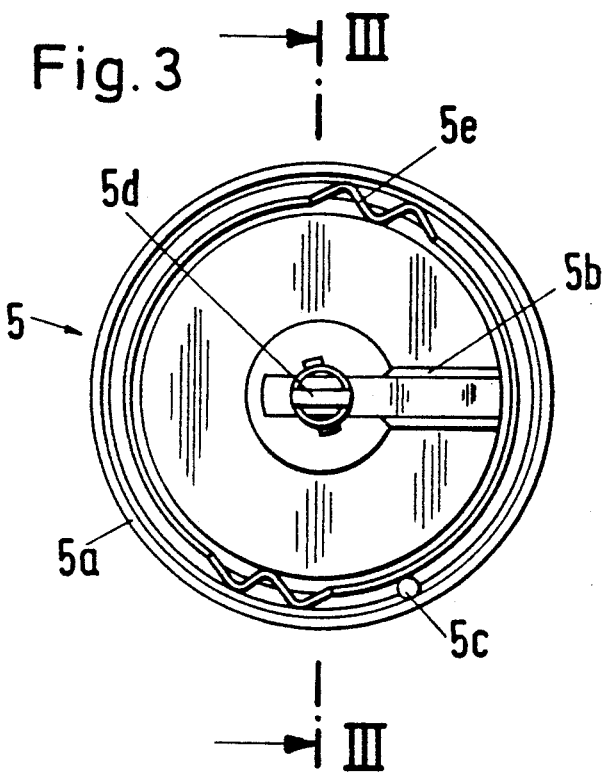
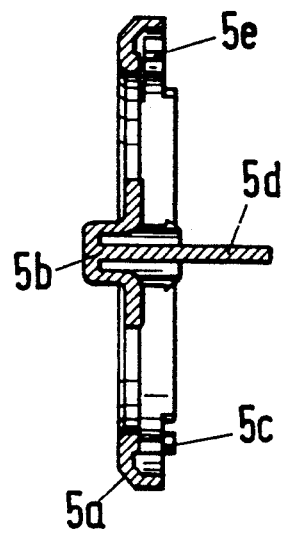
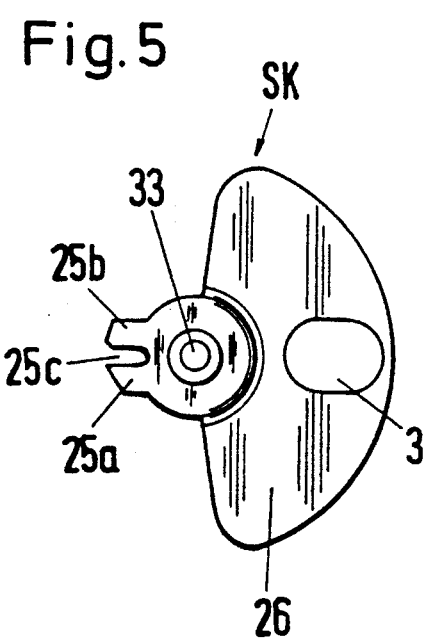
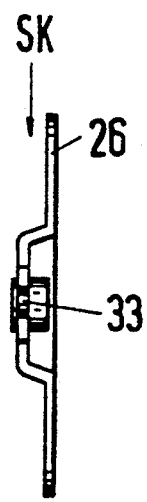

MULTIMETER WITH AT LEAST THREE INPUT CONNECTIONS AND MEANS FOR PREVENTING ERRORS DUE TO THE SELECTION OF AN INCORRECT INPUT CONNECTION

The invention relates to a multimeter having at least three input connections, preferably socket contacts, for connecting two measuring conductors, at least one of the measuring conductors being connected to a different one of the input connections assigned to a different measurable variable, upon changing a measurable variable to be determined, and a measurement range switch to be moved to a switch setting assigned to the chosen measurable variable.

Multimeters are universal among measuring instruments and because of their versatile applicability in laboratories and workshops as well as among hobbyists, they enjoy great popularity. The spectrum of measurable variables which is covered by many such instruments ranges from voltages through currents, resistances and levels, to frequencies, only to mention a few. Some of the measuring circuits which are required to detect the different measurable variables differ quite considerably, which means that different input circuits for the measurement also have to be available for the different measurable variables.

However, the versatility of multimeters also involves dangers. Thus, it is important for the correct input circuit assigned to the measurable variable to be determined to be connected before every measurement. For example, if the mains voltage is to be measured and the input circuit provided for the measurement of currents accidentally remains switched on, that may have serious consequences for the multimeter, and sometimes even for the operator, if the mains fuse does not switch off quickly enough. As a rule, the instrument fuse provided in the multimeter is not sufficient to isolate the multimeter from a high-energy voltage source since the arc which occurs upon opening the current circuit bridges the instrument fuse.

Similar problems and dangers may also arise for the test object, the multimeter and the operator in the case of other combinations in which a measurable variable is applied to an incorrect input circuit. However, even if no direct danger results from an operating error, an indirect danger can still always occur if, for example, the display of the multimeter simulates the absence of a voltage to be tested because an input circuit has been connected which happens to be inoperative, that is to say not connected to the measurement system. The simulated freedom from voltage sometimes encourages the operator to perform operations which endanger him or her.

Attention must be paid to the construction of the instrument in order to ensure that such incorrect operations do not occur with a multimeter. In many multimeters, the various input circuits have a first input connection which is common to all of the input circuits and a separate second input connection corresponding to the associated measurable variable assigned to the particular measuring circuit. As a rule, a plurality of measurement ranges are in turn associated with each measurable variable, for example the measurement ranges 1, 3, 10, 30 V etc. for the measurable variable "voltage". In such a case, the input circuit has a voltage divider across which all of the voltages are divided down to values, or even increased by amplification, so that values matched to the measurement system are available.

A measurement range switch is used to switch the voltage divider to a desired voltage measurement range or to switch shunts to a desired current measurement range. When operating the measuring instrument, care has to be taken to ensure that the measurement range switch is set to that measurable variable which is to be measured. At the same time, it is necessary to ensure that, on the input side of the multimeter, the measuring conductors are connected to the correct input connections, and consequently to the correct input circuit.

It is clear that, in the event of less concentrated activities, particularly also those carried out by unskilled people, one of the two operating movements may be forgotten and then either the incorrect input circuit would be connected or an incorrect measurement range would be switched on.

Of course, attempts have been made to keep the dangers of an incorrect operation within limits by using additional safety measures. The protective circuits used employ passive and active relay switches, controlled semiconductor switches incorporating transistors and thyristors, and fusible links of special construction. Despite the expenditure, which is sometimes quite high, it is by no means always possible with the prior art to safely switch off high-power voltage sources inside the small space available in modern multimeters if an error occurs. A reduction in danger can consequently only be achieved if incorrect operation is substantially excluded.

Attempts have been made to solve the problem by replacing the transposition of the measuring conductors through switching the input circuits. Although such a feature facilitated the operation of the measuring instrument somewhat, the problem was not eliminated. Thus, the switching of the input circuits could either be carried out by an additional input circuit switch or could additionally be taken over by the measurement range switch. An additional input circuit switch only shifts the problem to another component since it is then necessary to ensure with equal attentiveness that both the input circuit switch and the measurement range switch have been set to the measurable variable to be determined. On the other hand, a combination of all of the switching functions at the measurement range switch means that the latter has to be capable of switching not only very small but also large powers, and that again results in a considerable increase in the price of the component. In addition, it must be remembered that the reduction in the number of operating elements which is achieved as a result does not necessarily render the operation substantially safer, since even a single switch can always be set to an incorrect switch setting, and that inevitably also leads to the connection of an incorrect input circuit, with the corresponding consequences. In that respect, the need to ensure the correct setting of two operating elements may lead to increased attentiveness.

It is accordingly an object of the invention to provide a multimeter with at least three input connections, which overcomes the hereinafore-mentioned disadvantages of the heretofore-known devices of this general type and which operates with one measurement range switch which only has to switch very small powers for transmission to the measurement system, but prevents the operator from connecting an input circuit which is assigned to a measurable variable that has not been set at the measurement range switch.

With the foregoing and other objects in view there is provided, in accordance with the invention, a multimeter, comprising at least three input connections, preferably socket contacts, assigned to measurable variables for receiving two measuring conductors in one position for determining one measurable variable and for receiving at least one of the measuring conductors in another position for determining another measurable variable, a measurement range switch to be moved between switch settings assigned to the chosen measurable variables, and an electrically and/or mechanically operating disabling device coupled to the measurement range switch for selectively disabling the input connections and permitting the input connections to always receive only the measuring conductors carrying a test signal corresponding to a measurable variable set with the measurement range switch.

Since a disabling device is coupled to the respective switch setting of the measurement range switch according to the invention, it is possible to disable the input connections with respect to making a contact which accepts the test signal, in such a manner that contact can be made only to a particular input connection in each case. As a result of the coupling, the measurable variable assigned to the input connection corresponds to the measurable variable set at the measurement range switch. The coupling to the measurement range switch can be carried out either mechanically or electrically. In both cases, the user is protected against mistakenly switching on an input circuit for a measurable variable other than that selected at the measurement range switch, which substantially increases the operating safety of the measuring instrument.

In accordance with another feature of the invention, the measuring conductors have contact parts, which are preferably plugs, and the disabling device is a disabling link being connected to the measurement range switch and being movable upon actuation of the measurement range switch into different positions relative to the input connections for selectively preventing contact from being made to the input connections by the contact parts, and there are provided means for preventing the measurement range switch from being switched to a measurement range of another of the measurable variables with the measuring conductors connected.

In this particularly simply constructed disabling device, the rigid coupling between the measurement range switch and disabling link achieves a substantial gain in safety in this respect because if measurement conductors are connected, the plugged-in plugs fix the disabling link in its position, and consequently the measurement range switch is also protected against unintentional switching by the coupling elements. The user is consequently compelled to unplug the plug before switching to another measurable variable and consequently to release the disabling device. Opening the input circuit ensures that switching can only be carried out in the voltage-free state, so that no currents which endanger the switch contacts can flow. After switching has taken place, contact can again only be made to that input connection to which a measurable variable selected with the measurement range switch is assigned.

In accordance with a further feature of the invention, the input connections are socket contacts having receiving channels for receiving the plugs in a plugging direction, and the disabling link is formed of insulating material and is movable into a disabling position blocking at least one of the receiving channels transversely to the plugging direction for excluding a contacting introduction of the plugs into a respective one of the input connections.

There are any number of variants for the detailed construction of a mechanically acting disabling device, which cannot all be mentioned herein.

In accordance with an added feature of the invention, the disabling link is preferably a rotating or sliding link matched to the type and construction of the associated measurement range switch, the input connections are socket contacts, and the disabling device is a disabling link having at least one cutout formed therein corresponding in position to at least one of the switch settings of the measurement range switch for releasing at least one of the socket contacts assigned to the measurable variable set by the measurement range switch.

In accordance with an additional feature of the invention, the disabling device is a disabling link, and there is provided a housing having a housing wall, such as a covering wall, with a recess formed therein in the vicinity of the input connections for receiving and mounting the disabling link, the disabling link being movable in the recess to outwardly cover at least one of the input connections, and the measurement range switch having a manually actuable actuating part, such as a switch wheel, for positionally altering the disabling link corresponding to the input connections.

In accordance with yet another feature of the invention, in order to couple the measuring range switch and the disabling link, the disabling link is a rotatable element, the actuating part and the disabling link are disposed in the same plane or in mutually spaced apart parallel planes, and there are provided coupling elements providing a mutual engagement effecting a forcible coupling of the disabling link at least over a partial region of a rotary movement of the switch element to be performed by the actuating part.

The purpose of structures in which a rigid coupling to the disabling link does not take place over the entire region of rotation of the measurement range switch is to enable switching to different measurement ranges of the same measurable variable without anything changing in the position of the disabling link as a result.

In accordance with yet a further feature of the invention, the disabling link is a rotatable element, the switch wheel has a first coupling element, such as at least one stud, and the rotatable disabling link has at least one second coupling element, such as a two-pronged fork forming a Geneva-type movement along with the first coupling element, to be engaged by the first coupling element.

A switch wheel constructed on the actuating part has at least one tooth with which it can engage in another tooth of the rotatable disabling link, preferably in the groove of a two-pronged fork, as in a Geneva movement.

In accordance with yet an added feature of the invention, the at least one second coupling element is a two-pronged fork defining a guide groove, and the first coupling element is at least one stud sliding into the guide groove in one direction of rotation and sliding out of the guide groove in an opposite direction of rotation.

In accordance with yet an additional feature of the invention, the switch wheel has a region of rotation with only one part in which a forceful coupling is maintained, and the switch wheel can be turned further to a stop limiting the region of rotation as soon as the at least one stud has left the guide groove, while the disabling link remains in a rest position.

In accordance with again another feature of the invention, the switch wheel has given locations at which a plurality of the measurement ranges are assigned to one of the input connections, and the switch wheel runs free relative to the disabling link at the given locations.

In accordance with again a further feature of the invention, the input connections are disposed along a straight line, the measurement range switch rotates with a mismatch relative to the input connections, and the disabling device is a disabling link having a cutout formed therein being elongated to compensate for the mismatch and to release one of the input connections when appropriately positioned.

The cutout provided in the disabling link for releasing certain input connections must be formed in such a way that upon switching, it corresponds to the relevant position of the input connection. In a disabling link constructed as a rotatable disc, the cutout may be a round hole if the input connections are situated on a corresponding circular arc.

If, on the other hand, the input connections are situated, as is usual, along a straight line, the cutout should be formed as an elongated hole in order to compensate for the mismatch produced during the rotation.

In accordance with again an added feature of the invention, the disabling device is a disabling link having individual disabling slides, springs each holding a respective one of the disabling slides in a rest position, and a cam-type slide driven by the measurement range switch for displacing the disabling slides against the force of the springs and moving the disabling slides to positions disabling the input connections.

Accordingly, a single-piece disabling link with suitable cutout can be replaced by a disabling link constructed from a plurality of disabling slides. Furthermore, the actuating part of the measurement range switch may at the same time act on the cam-type slide by a translation or rotation.

In accordance with a concomitant feature of the invention, in an electrically acting disabling device, at least one of the input connections, which may be socket contacts, has a disabling element assuming a disabling position preventing contact if the measurable variable set at the measurement range switch does not agree with the measurable variable assigned to the input connection, the disabling element is preferably actuated electromagnetically, and the measurement range switch has at least one switching section triggering electromagnetic actuation of the disabling element. The socket contacts may have receiving channels for the measuring conductors, and the disabling element may assume the disabling position by blocking the receiving channel of one of the socket contacts. Accordingly, a coupling of the electromagnetically actuated disabling element to the measurement range switch is again necessary and is achieved by feeding a triggering switching circuit through a switching section of the measurement range switch.

Other features which are considered as characteristic for the invention are set forth in the appended claims.

Although the invention is illustrated and described herein as embodied in a multimeter with at least three input connections, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 3 is a plan view of a switch element;

FIG. 4 is a sectional view of a switch element as seen from the side;

FIG. 5 is a plan view of a rotatable disabling link;

FIG. 6 is a side-elevational view of a rotatable disabling link;

Figure 1:
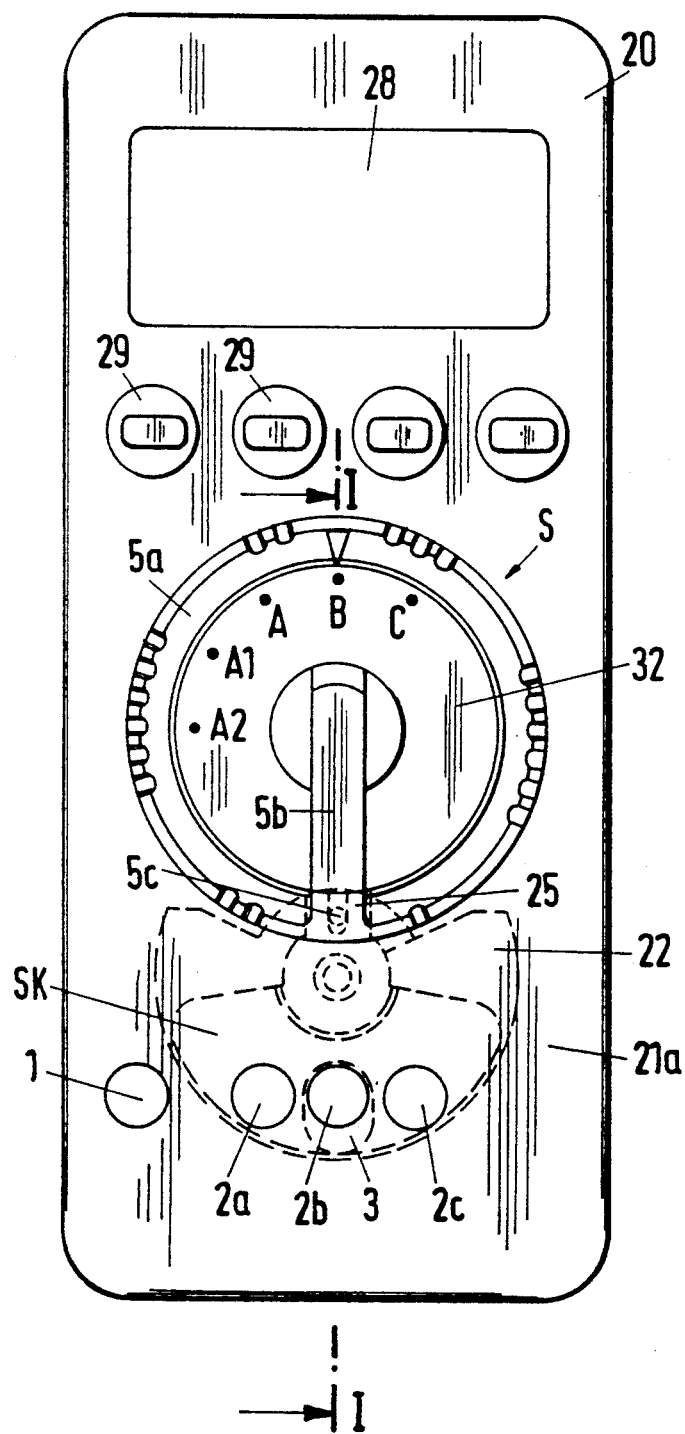
FIG. 1 is a diagrammatic plan view of a multimeter with a rotatable disabling link.
Figure 2:
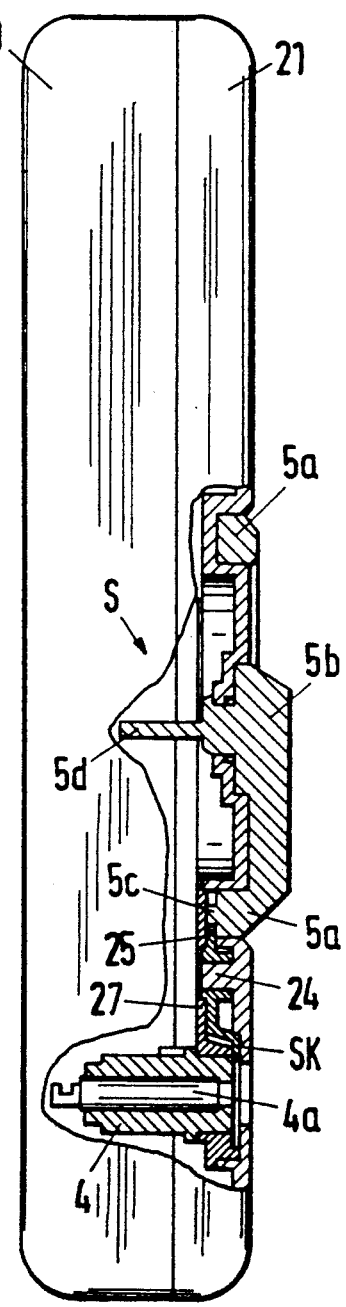
FIG. 2 is a side-elevational view of a multimeter according to FIG. 1, being partially broken away along a line I—I of FIG. 1, in the direction of the arrows.

Referring now to the figures of the drawing in detail and first, particularly, to FIGS. 1 and 2 thereof, there is seen a first embodiment which is one of various possibilities of coupling a measurement range switch to a mechanically acting disabling device. A display 28, a plurality of operating elements 29, a measurement range switch S and input connections or socket contacts 1 and 2a to 2c, are visible in the vicinity of a cover plate 21a of a multimeter housing 20. A disabling link SK coupled to the measurement range switch S is depicted only by broken lines in FIG. 1 since it is situated in a recess 22 inside the cover plate or covering wall 21a, and is not visible from the outside.

Further details of the measurement range switch S, and more precisely of its actuating part 5, which are important for its interaction with the disabling link SK, are illustrated by means of the component drawings in FIGS. 3 to 6. The actuating part 5 of the measurement range switch S includes an annularly shaped switch wheel 5a, a switch twist knob 5b, a first coupling element 5c which is constructed as a stud, and a switch blade 5d serving as a drive for non-illustrated contact carrier plates of the measurement range switch. The switch blade 5d is connected to the switch wheel 5a by the switch twist knob 5b which acts as a ridge or crosspiece. The stud-like first coupling element 5c formed on the switch wheel 5a makes permits an engagement, which couples the two parts to one another, at a second coupling element 25 associated with the switch link SK.

The coupling device functions similar to a single-arm geneva movement with a two-pronged fork 25a, 25b which forms a guide groove 25c receiving the stud-type first coupling element 5c. If a selected rotary angle is exceeded during a rotary actuation of the switch wheel 5, the stud-like first coupling element 5c slides out of the guide groove 25c and consequently releases the rigid coupling between the two parts. In this region it is possible to rotate the measurement range switch S further and optionally to set it to other measurement ranges that are usually associated with the same measurable variable, while the disabling link SK remains in its final position. It is only upon turning back the switch wheel 5a that the first coupling element 5c engages in the second coupling element 25 upon reaching it and ensures that the disabling link SK is at least driven to the next switch setting.

In the present example according to FIG. 1, the input connections 2a, 2b, 2c of the measuring instrument are each assigned to particular measurable variables A, B, C, and the common input connection 1 for all three input connections. The disabling link SK has a cutout 3 formed therein which releases a completely defined input connection 2a or 2b or 2c, depending on the switch setting of the measurement range switch S. The measurement range switch S has been set to the measurable variable B and in this position the disabling link SK only releases the input connection 2b. If the measurement range switch S is rotated further clockwise to the measurable variable C, the disabling link SK would move correspondingly and release the input connection 2c. The cutout 3 is shaped as an elongated hole so as to compensate for the mismatch or offset that is produced upon rotating the disabling link SK, with respect to the input connections 2a to 2c which are disposed along a straight line. If the input connections 2a to 2c are disposed in such a manner that they are situated along a circular arc with respect to the mounting position of the disabling link SK, a circular cutout having an adequate diameter is sufficient.

The disabling link SK is mounted by means of a mounting stud 24 which is constructed on the inside of the covering wall 21a and which engages in a mounting hole 33 in the disabling link SK. The actuating part 5 is also mounted in the covering wall 21a, but is put on from the outside. Starting from the plane in which the coupling elements 5c, 25 are situated, the disabling link SK extends to a disabling plate 26 in which the cutout 3 is situated, in such a manner that it can slide over the input connections 2a, 2b, 2c that are constructed as socket contacts and always releases only a particular receiving channel 4a. Towards the inside of the housing, the disabling link is far more protected by a cover 27 covering the recess or cutout 22. The cutout 22 should be dimensioned according to the size and the angle of rotation of the disabling link SK.

Figure 7:
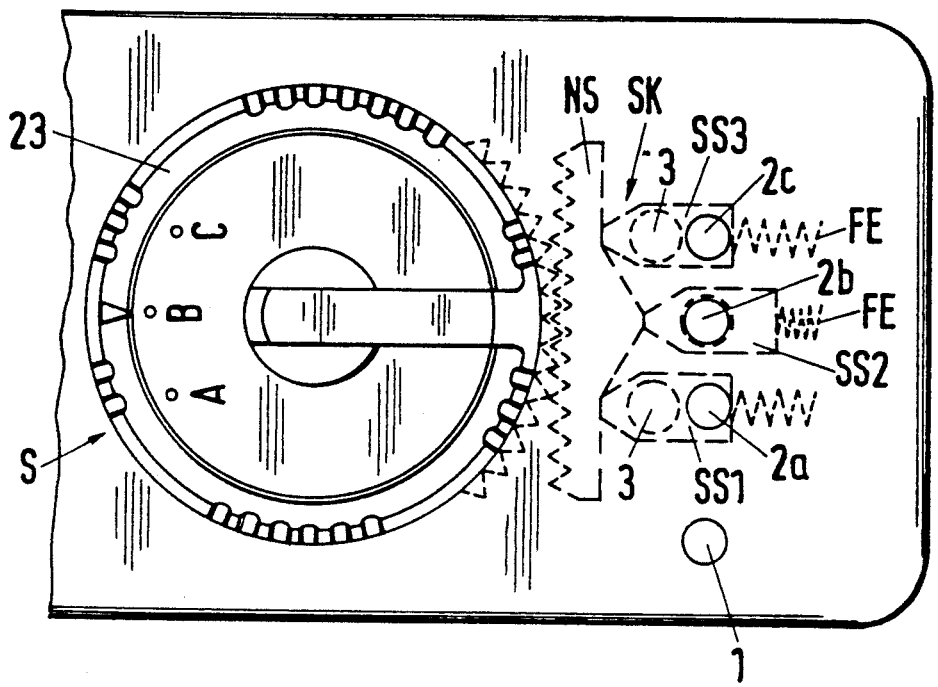
FIG. 7 is a fragmentary plan view of a disabling link with individual disabling slides.
Figure 8:
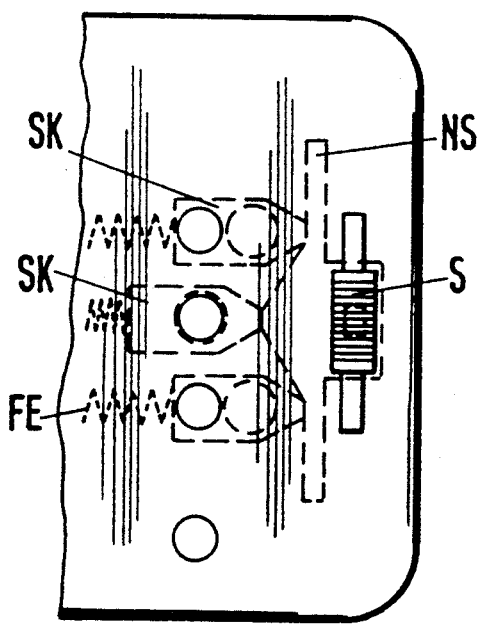
FIG. 8 is a fragmentary plan view of a measurement range switch being constructed as a sliding switch having a plurality of disabling slides as a disabling link.
Figure 9:
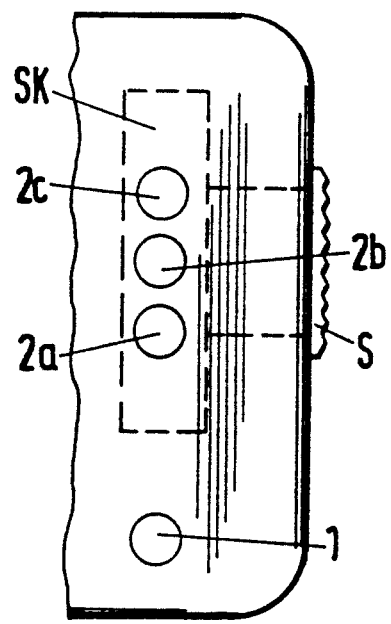
FIG. 9 is a fragmentary plan view of a measurement range switch being constructed as sliding switch having a single disabling link.

As FIGS. 7 to 9 show, there is a multiplicity of possible solutions as to how a disabling link SK that is coupled to the measurement range switch S, can disable or release particular input connections 2a to 2c with respect to a contacting connection of measuring conductors. Thus, in FIG. 7 the disabling link SK is constructed with the aid of three disabling slides SS1 to SS3, each of which is held in a disabling position with the aid of a spring FE. The disabling slides SS1 to SS3 can only be displaced from the disabling position by a cam-type slide NS in order to reach a release position. In the present example, the cam-type slide NS ensures that the cutout 3 in the disabling slide SS2 releases the input connection 2b. The input connection 2b is assigned to the measurable variable B set at the measurement range switch S.

The mode of action of the disabling link according to FIG. 8 corresponds to that of FIG. 7, except that the cam-type slide NS is driven solely by a rectilinearly moved measurement range switch S which is constructed as a sliding switch and not, as in FIG. 7, by a rotatable measurement range switch S.

FIG. 9 shows that the actuating part associated with the measurement range switch S need not necessarily be fitted on the operating surface of the measuring instrument housing, but obviously it can also be disposed on one of its side surfaces. In this case, a disabling link of a particularly simple type is used since its rectilinear displacement corresponds directly to the rectilinear configuration of the input connections 2a to 2c.

Figure 10:
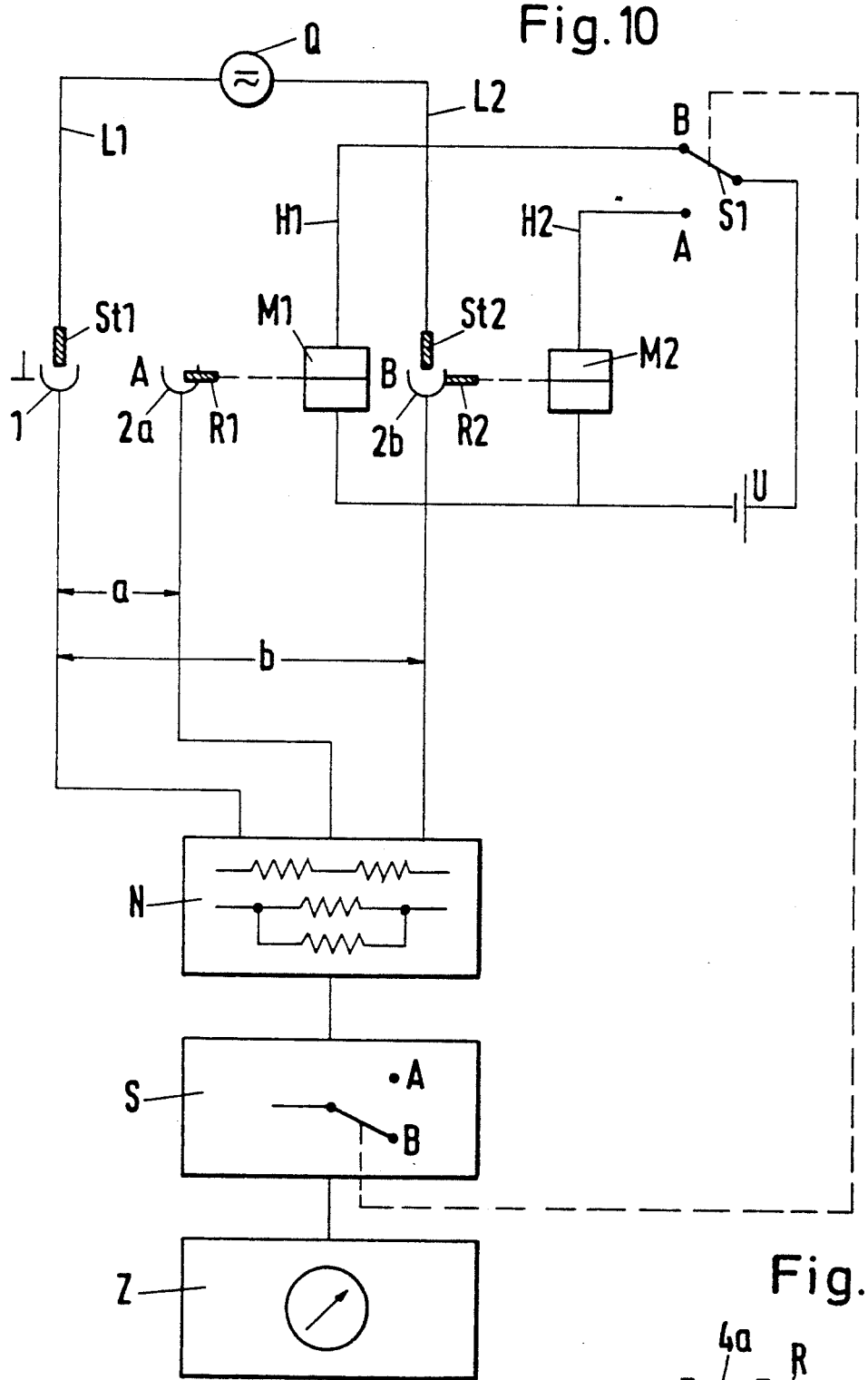
FIG. 10 is a schematic circuit diagram of a measurement range switch having an electromagnetic disabling device.
Figure 11:
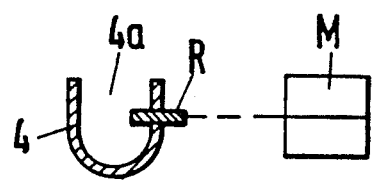
FIG. 11 is a schematic and diagrammatic view of a socket contact with an electromagnetically driven safety catch.

FIGS. 10 and 11 show that the disabling of particular input connections 2a, 2b is also possible with the aid of an electromagnetically actuated safety catch R. FIG. 10 shows the coupling of the measurement range switch S to two auxiliary circuits H1, H2 in each of which a magnetic positioner M1, M2 is disposed. In each case, the magnetic positioners M1, M2 are able to use a safety catch R1, R2 to disable the associated input connection 2a, 2b with respect to a contacting connection of a measuring conductor L1, L2 with a plug ST1, ST2. In the present example, the measurement range switch S is provided with an additional switching section S1 which is assigned according to the selection made by the measurement range switch S to the measurable variable B, which is at the same time also assigned to the input connection 2a, which connects the auxiliary circuit H1 to a voltage source U, and which consequently activates the magnetic positioner M1 which in turn disables the input connection 2a with the safety catch R1. Starting from a test object Q, that is depicted as a voltage source, the measuring conductors L1, L2 provided with the plugs ST1, ST2 can only make contact with a common input connection 1 and the input connection 2b assigned to the measurable variable B1, and consequently can close the input circuit b. Therefore, the three input connections are assigned to the measurable variables A, B, C for receiving the two measuring conductors L1, L2 in one position of both conductors for determining one measurable variable and for receiving at least one of the measuring conductors L1, L2 in another position of the conductors for determining another measurable variable. Through the use of a measurement range network N which is connected to the measurement range switch S and which must suit the particular measurable variable with regard to type and construction, the test signal reaches an actual measurement system Z which takes care of the evaluation and display of the test signal. After switching the measurement range switch S to the measurable variable A, the magnetic positioner M1 would again pull back the associated safety catch R1 into the starting position, and consequently release the input connection for the measurable variable A, while the second magnetic positioner M2 would then be activated and would disable the input connection 2b by means of the second safety catch R2.

FIG. 11 is intended to illustrate the input connections 2a, 2b being constructed as a socket contact 4 having the safety catch R which is driven by a magnetic positioner M and which closes the receiving channel 4a of the socket contact 4 with respect to a contact being made.

What is claimed is:

1. A multimeter, comprising at least three input connections assigned to measurable variables for receiving two measuring conductors in a position for determining one measurable variable and for receiving at least one of the measuring conductors in another position for determining another measurable variable, a measurement range switch to be moved between switch setting positions assigned to the measurable variables, and a disabling device coupled to the setting positions of said measurement range switch for selectively operatively disabling said input connections and permitting said input connections to receive only one of the measuring conductors carrying a test signal corresponding to a measurable variable set with said measurement range switch.

2. The multimeter according to claim 1, wherein said input connections are socket contacts.

3. The multimeter according to claim 1, wherein said disabling device operates electrically and mechanically.

4. The multimeter according to claim 1, wherein said disabling device operates electrically.

5. The multimeter according to claim 1, wherein said disabling device operates mechanically.

6. The multimeter according to claim 1, wherein the measuring conductors have contact parts, and said disabling device is a disabling link being connected to said measurement range switch and being movable upon actuation of said measurement range switch into different positions relative to said input connections for selectively preventing contact from being made to said input connections by the contact parts, and including means for preventing said measurement range switch from being switched to a measurement range of another of the measurable variables with the measuring conductors connected.

7. The multimeter according to claim 6, wherein said contact parts are plugs.

8. The multimeter according to claim 7, wherein said input connections are socket contacts having receiving channels for receiving the plugs in a plugging direction, and said disabling link is formed of insulating material and is movable into a disabling position blocking at least one of said receiving channels transversely to the plugging direction fo excluding a contacting introduction of said plugs into a respective one of said input connections.

9. The multimeter according to claim 1, wherein said input connections are socket contacts, and said disabling device is a disabling link having at least one cutout formed therein corresponding in position to at least one of said switch settings of said measurement range switch for releasing at least one of said socket contacts assigned to the measurable variable set by said measurement range switch.

10. The multimeter according to claim 9, wherein said disabling link is a rotating link.

11. The multimeter according to claim 9, wherein said disabling link is a sliding link.

12. The multimeter according to claim 1, wherein said disabling device is a disabling link, and wherein the multimeter includes a housing having a housing wall with a recess formed therein in the vicinity of said input connections for receiving and mounting said disabling link, said disabling link being movable in said recess to outwardly cover at least one of said input connections, and said measurement range switch having a manually actuable actuating part for positionally altering said disabling link corresponding to said input connections.

13. The multimeter according to claim 12, wherein said housing wall is a covering wall.

14. The multimeter according to claim 12, wherein said actuating part is a switch wheel.

15. The multimeter according to claim 14, wherein said disabling link is a rotatable element, said switch wheel has a first coupling element, and said rotatable disabling link has a second coupling element to be engaged by said first coupling element.

16. The multimeter according to claim 15, wherein said first coupling element is at least one stud.

17. The multimeter according to claim 16, wherein said at least one second coupling element is a two-pronged fork forming a Geneva-type movement along with said first coupling element.

18. The multimeter according to claim 15, wherein said at least one second coupling element is a two-pronged fork defining a guide groove, and said first coupling element is at least one stud sliding into said guide groove in one direction of rotation and sliding out of said guide groove in an opposite direction of rotation.

19. The multimeter according to claim 18, wherein said switch wheel has a region of rotation with only one part in which a forceful coupling is maintained, and said switch wheel can be turned further to a stop limiting said region of rotation as soon as said at least one stud has left said guide groove, while said disabling link remains in a rest position.

20. The multimeter according to claim 14, wherein said switch wheel has given locations at which a plurality of the measurement ranges are assigned to one of said input connections, and said switch wheel runs free relative to said disabling lir'. at said given locations.

21. The multimeter according to claim 12, wherein said disabling link is a rotatable element, said actuating part and said disabling link are disposed in the same plane, and including coupling elements providing a mutual engagement effecting a forcible coupling of said disabling link at least over a partial region of a rotary movement to be performed by said actuating part.

22. The multimeter according to claim 12, wherein said disabling link is a rotatable element, said actuating part and said disabling link are disposed in mutually spaced apart parallel lines, and including coupling elements providing a mutual engagement effecting a forcible coupling of said disabling link at least over a partial region of a rotary movement to be performed by said actuating part.

23. The multimeter according to claim 1, wherein said input connections are disposed along a straight line, said measurement range switch rotates with a mismatch relative to said input connections, and said disabling device is a disabling link having a cutout formed therein being elongated to compensate for the mismatch and to release one of said input connections when appropriately positioned.

24. The multimeter according to claim 1, wherein said disabling device is a disabling link having individual disabling slides, springs each holding a respective one of said disabling slides in a rest position, and a cam-type slide driven by said measurement range switch for displacing said disabling slides against the force of said springs and moving said disabling slides to positions disabling said input connections.

25. The multimeter according to claim 1, wherein at least one of said input connections has a disabling element assuming a disabling position preventing contact if the measurable variable set at said measurement range switch does not agree with the measurable variable assigned to said input connection.

26. The multimeter according to claim 25, wherein said input connections are socket contacts.

27. The multimeter according to claim 25, wherein said disabling element is actuated electromagnetically, and said measurement range switch has at least one switching section triggering electromagnetic actuation of said disabling element.

28. The multimeter according to claim 25, wherein said socket contacts have receiving channels for the measuring conductors, and said disabling element assumes said disabling position by blocking said receiving channel of one of said socket contacts.

* * * * *